United States Patent
Altun et al.

(10) Patent No.: US 10,720,522 B1
(45) Date of Patent: Jul. 21, 2020

(54) CMOS COMPATIBLE DEVICE BASED ON FOUR-TERMINAL SWITCHING LATTICES

(71) Applicant: Istanbul Teknik Universitesi, Istanbul (TR)

(72) Inventors: Mustafa Altun, Istanbul (TR); Serzat Safaltin, Istanbul (TR); Ismail Cevik, Istanbul (TR)

(73) Assignee: ISTANBUL TEKNIK UNIVERSITESI, Istanbul (TR)

( * ) Notice: Subject to any disclaimer, the term of this patent is extended or adjusted under 35 U.S.C. 154(b) by 0 days.

(21) Appl. No.: 16/364,129

(22) Filed: Mar. 25, 2019

(51) Int. Cl.
| | | |
|---|---|---|
| *H01L 29/78* | (2006.01) | |
| *H01L 21/8238* | (2006.01) | |
| *H01L 27/02* | (2006.01) | |
| *H01L 29/417* | (2006.01) | |
| *H01L 29/66* | (2006.01) | |

(52) U.S. Cl.
CPC ...... *H01L 29/78* (2013.01); *H01L 21/823807* (2013.01); *H01L 21/823814* (2013.01); *H01L 21/823828* (2013.01); *H01L 21/823871* (2013.01); *H01L 27/0203* (2013.01); *H01L 29/41775* (2013.01); *H01L 29/66568* (2013.01)

(58) Field of Classification Search
CPC . H01L 29/66568–66659; H01L 21/041; H01L 21/22–228; H01L 21/38–388; H01L 21/76858; H01L 21/8238–823892; H01L 29/41725–41791; H01L 29/7839; H01L 29/806; H01L 29/0843–0891
See application file for complete search history.

(56) References Cited

U.S. PATENT DOCUMENTS

| | | | |
|---|---|---|---|
| 4,638,344 A | | 1/1987 | Cardwell, Jr. |
| 5,557,569 A | * | 9/1996 | Smayling ........... G11C 16/0416 257/316 |
| 5,757,046 A | * | 5/1998 | Fujihira ............. H01L 29/0619 257/339 |
| 7,365,377 B2 | | 4/2008 | Sugahara et al. |
| 8,633,547 B2 | | 1/2014 | Masleid et al. |
| 9,847,334 B1 | | 12/2017 | More et al. |
| 2004/0033627 A1 | * | 2/2004 | Aytur ............... G01N 33/54373 436/526 |
| 2004/0120175 A1 | * | 6/2004 | Schrom ............... H01L 27/0705 365/51 |

(Continued)

OTHER PUBLICATIONS

Mustafa Altun et al., Lattice-based computation of Boolean functions, in Proceedings of the 47th Design Automation Conference (DAC), 2010.

(Continued)

*Primary Examiner* — Scott B Geyer
(74) *Attorney, Agent, or Firm* — Bayramoglu Law Offices LLC

(57) ABSTRACT

The invention relates to a device, named four-terminal switch, and a switching lattice comprising four-terminal switches. A four-terminal switch operates and can be fabricated according to the principles of complementary metal oxide semiconductor (CMOS) technology. However, it has four source/drain terminals as opposed to two terminals in conventional MOS devices; it is able to conduct current in two dimensions between four terminals as opposed to one-dimensional current flow in conventional MOS devices; and it is able to form dense switching lattice structures for area efficiency.

8 Claims, 20 Drawing Sheets

(56) References Cited

U.S. PATENT DOCUMENTS

| | | | |
|---|---|---|---|
| 2014/0103434 A1* | 4/2014 | Lu | H01L 29/41758 |
| | | | 257/346 |
| 2018/0182794 A1* | 6/2018 | Go | H01L 27/14641 |

OTHER PUBLICATIONS

Mustafa Altun et al., Logic synthesis for switching lattices, IEEE Transactions on Computers, 2012, pp. 1588-1600, vol. 61.

Graeme Gange et al., Synthesizing optimal switching lattices, ACM Transactions on Design Automation of Electronic Systems, 2014, pp. 6:1-6:14, vol. 20.

Anna Bernasconi et al., Logic synthesis for switching lattices by decomposition with p-circuits, 2016 Euromicro Conference on Digital System Design, 2016, pp. 423-430.

Anna Bernasconi et al., Synthesis of switching lattices of dimensional-reducible boolean functions, in VLSI-SoC, 2016, pp. 1-6. A.

Anna Bernasconi et at, Composition of switching lattices for regular and for decomposed functions, Microprocessors and Microsystems, 2008, pp. 207-218, vol. 60.

M. Ceylan Morgul et al., Optimal and heuristic algorithms to synthesize lattices of four-terminal switches, Integration, Aug. 15, 2018.

Levent Aksoy et al., A satisfiability-based approximate algorithm for logic synthesis using switching lattices, to be in the proceedings of Design, Automation, and Test in Europe (DATE), 2019.

\* cited by examiner

CMOS COMPATIBLE DEVICE BASED ON FOUR-TERMINAL SWITCHING LATTICES

TECHNICAL FIELD

The invention relates to a device, named four-terminal switch, and a switching lattice comprising four-terminal switches. A four-terminal switch operates and can be fabricated according to the principles of complementary metal oxide semiconductor (CMOS) technology. However, it has four source/drain terminals as opposed to two terminals in conventional MOS devices; it is able to conduct current in two dimensions between four terminals as opposed to one-dimensional current flow in conventional MOS devices; and it is able to form dense switching lattice structures for area efficiency.

BACKGROUND

Computing with switching lattices consisting of four-terminal switches was first proposed in [1]. Since then there have been many studies in the literature focusing on the optimization of the size of switching lattices, in terms of the number of four terminal switches, to implement a given Boolean function [2-8]. However, the literature lacks concrete justifications for device realization of switching lattices. In this invention, we develop a CMOS-technology-compatible device for a four-terminal switch, and show the formation of a lattice using this device.

[1] M. Altun and M. Riedel, "Lattice-based computation of Boolean functions," in Proceedings of the 47th Design Automation Conference (DAC), 2010.
[2] M. Altun and M. Riedel, "Logic synthesis for switching lattices," IEEE Transactions on Computers, vol. 61, pp. 1588-1600, 2012.
[3] G. Gange, H. Søndergaard, and P. J. Stuckey, "Synthesizing optimal switching lattices," ACM TODAES, vol. 20, pp. 6:1-6:14, 2014.
[4] A. Bernasconi, V. Ciriani, L. Frontini, V. Liberali, G. Trucco, and T. Villa, "Logic synthesis for switching lattices by decomposition with p-circuits," in DSD, 2016, pp. 423-430.
[5] A. Bernasconi, V. Ciriani, L. Frontini, and G. Trucco, "Synthesis of switching lattices of dimensional-reducible boolean functions," in VLSI-SoC, 2016, pp. 1-6. A.
[6] Bernasconi, V. Ciriani, L. Frontini, and G. Trucco, "Composition of switching lattices for regular and for decomposed functions," MICPRO, vol. 60, pp. 207-218, 2018.
[7] M. Morgul and M. Altun, "Optimal and heuristic algorithms to synthesize lattices of four-terminal switches," Integration, in press.
[8] L. Aksoy and M. Altun, "A satisfiability-based approximate algorithm for logic synthesis using switching lattices," to be in the proceedings of Design, Automation, and Test in Europe (DATE), 2019.

The dominant technology in electronic device technology is the CMOS technology. Today, the most widely used devices are based on a two-terminal switching architecture. Two-terminal switches are realized with MOSFET devices comprising gate, source, drain and bulk terminals. The gate is located over the channel between source and drain. When voltage is applied between the gate and the bulk, gate and majority carriers are collected in the channel resulting in current flow between drain and source terminals. Concentration of collected carriers controls magnitude of the electric current. These devices act as two-terminal switches controlled by the gate. While no current flows between source and drain in the two-terminal switches which are off, a significant current can flow between source and drain in two-terminal switches which are on. Logic functions are implemented by turning switches on or off. This technology continues to be used as the mainstay of modern electronic computers and related technologies. We develop a CMOS-technology-compatible device for a four-terminal switch, and show the formation of a lattice using this device.

The U.S. Pat. No. 7,365,377 refers to a four-terminal transistor based lattice-shaped structure; here, a back gate bias is applied to a four-terminal transistor in an LSI. The deep N-well region, all of the N-well regions and the P-well regions are placed in the same structure. The back gates of the N-channel MOS transistors and all of the P-channel MOS transistors on the chip are interconnected. In the related document, the functionality of the interconnections is highlighted and it is mentioned that there will be restrictions on the dimensions of the device due to required connections.

The U.S. Pat. No. 4,638,344 refers to a system which can be integrated into real three-dimensional circuits and all other known devices having connections that are made of the same conductivity type material. Therefore, metal contacts, electrodes, or interconnections are not required to form the system. As there is no need for metal interconnections and insulation regions the system has been made more suitable to create more concentrated forms of logic than known systems. In the relevant document, it is possible to operate with the control of the channel placement. Switching is carried out by two-terminals.

The U.S. Pat. No. 8,633,547B2 refers to a physical system layout of a semiconductor system comprising MOSFETs (metal oxide semiconductor field effect transistors) formed on a semiconductor substrate. The development of this physical settlement minimizes the use of time and resource. Here, a metal lattice structure in which metal layers, N-well regions, and deep N-well regions are positioned under one surface of the semiconductor device.

The U.S. Pat. No. 9,847,334 refers to a semiconductor system having high dimensional capability, feature size (the smallest component that can be created using a manufacturing process), functional density (number of interconnected devices for each chip die). This system provides benefits by increasing production efficiency and reducing related costs.

Although, the above mentioned patents are related to a CMOS or a CMOS-compatible device or technology, and some of them mention lattice structures. None of these patents is about switching lattices consisting of four-terminal switches. Therefore, there is no direct connection of these patents with the invention.

SUMMARY

The aim of the invention is to develop a device, named four-terminal switch, and a switching lattice comprising four-terminal switches, and to show that it operates and can be fabricated according to the principles of complementary metal oxide semiconductor (CMOS) technology.

Device subject to the invention includes:
a body layer containing all of the components,
one or four channel regions located at the surface of the body layer,
four diffusion regions created on the surface of the body layer around the channel region or regions,
Local Oxide (LOCOS) or Shallow Trench Isolation (STI) layers located in the body layer, gate insulator located over the channel,
a gate metal layer located on the gate insulator,
a floating diffusion node located between 4 channel regions in 4 channel structures, The benefits of the device according to the invention are listed below;

High Efficiency for Circuit Area and Power due to High Interconnect-Efficiency

High Efficiency for Circuit Area and Power due to the Device's Ability to Conduct Current in Two Dimensions CMOS Technology Compatibility Direct Implementation of the Four-Terminal Switch with Two-Terminal CMOS (MOS transistors) Switches

BRIEF DESCRIPTION OF THE DRAWINGS

The device developed to achieve the aims of the invention is illustrated in the attached figures.

These Figures are.

Figure 1:
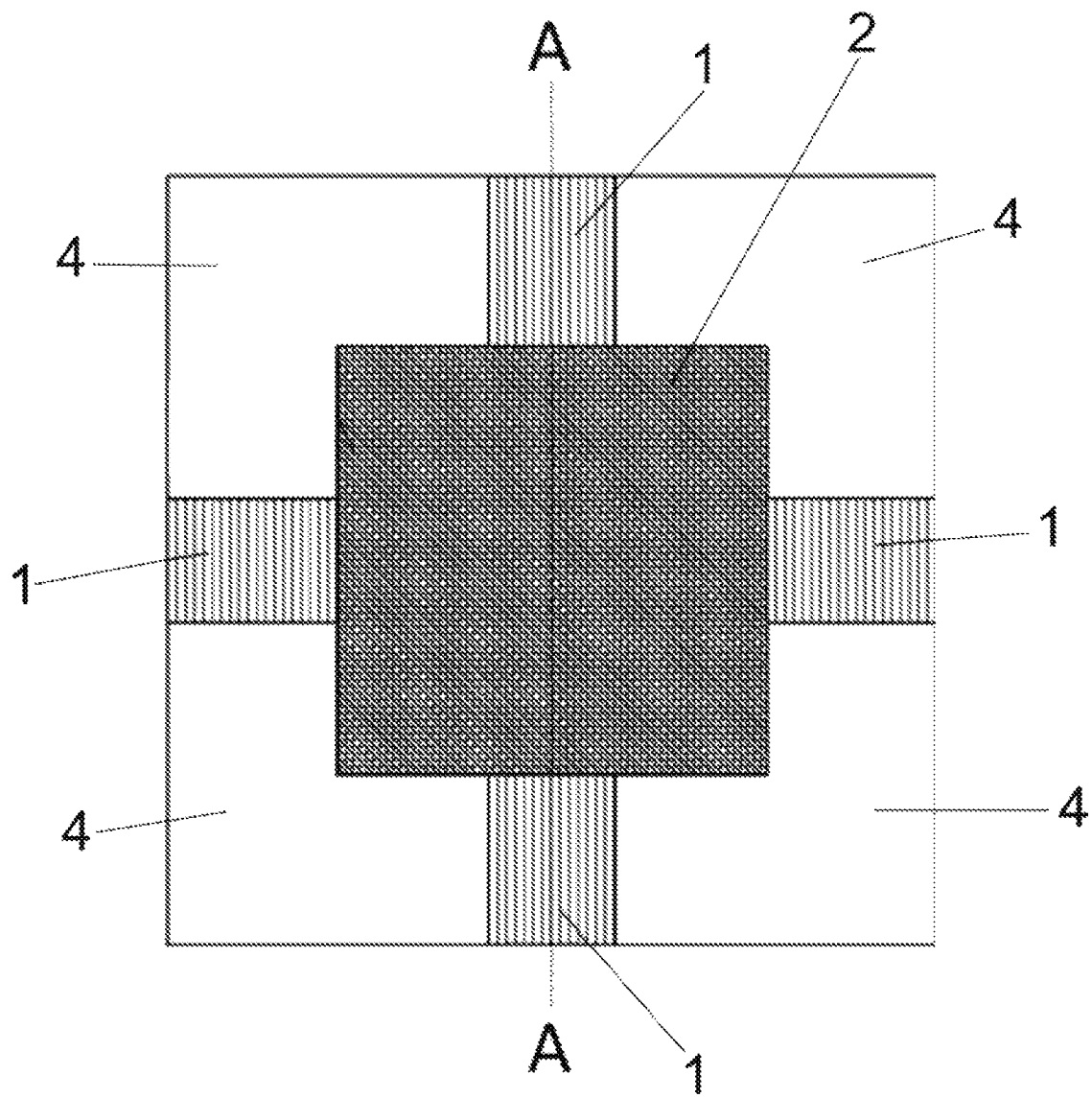
FIG. 1: A top view of the four-terminal switch device with a square-shaped planar gate, which is the subject of the invention.
Figure 2:
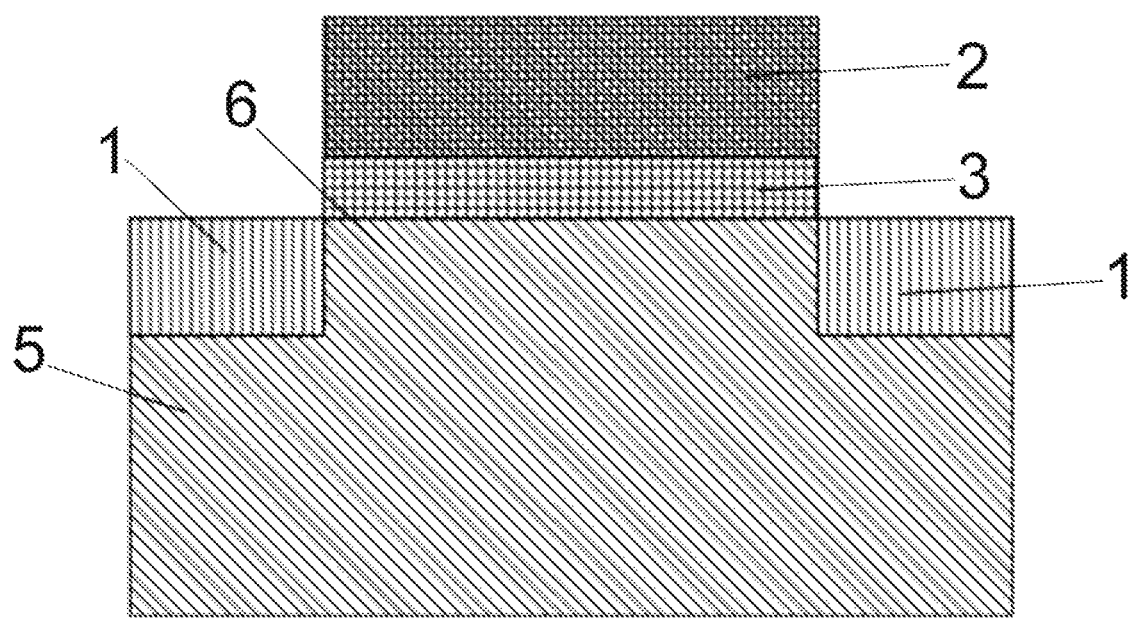
FIG. 2: Cross-sectional view of the four-terminal switch device with a square-shaped planar gate, which is the subject of the invention.
Figure 3:
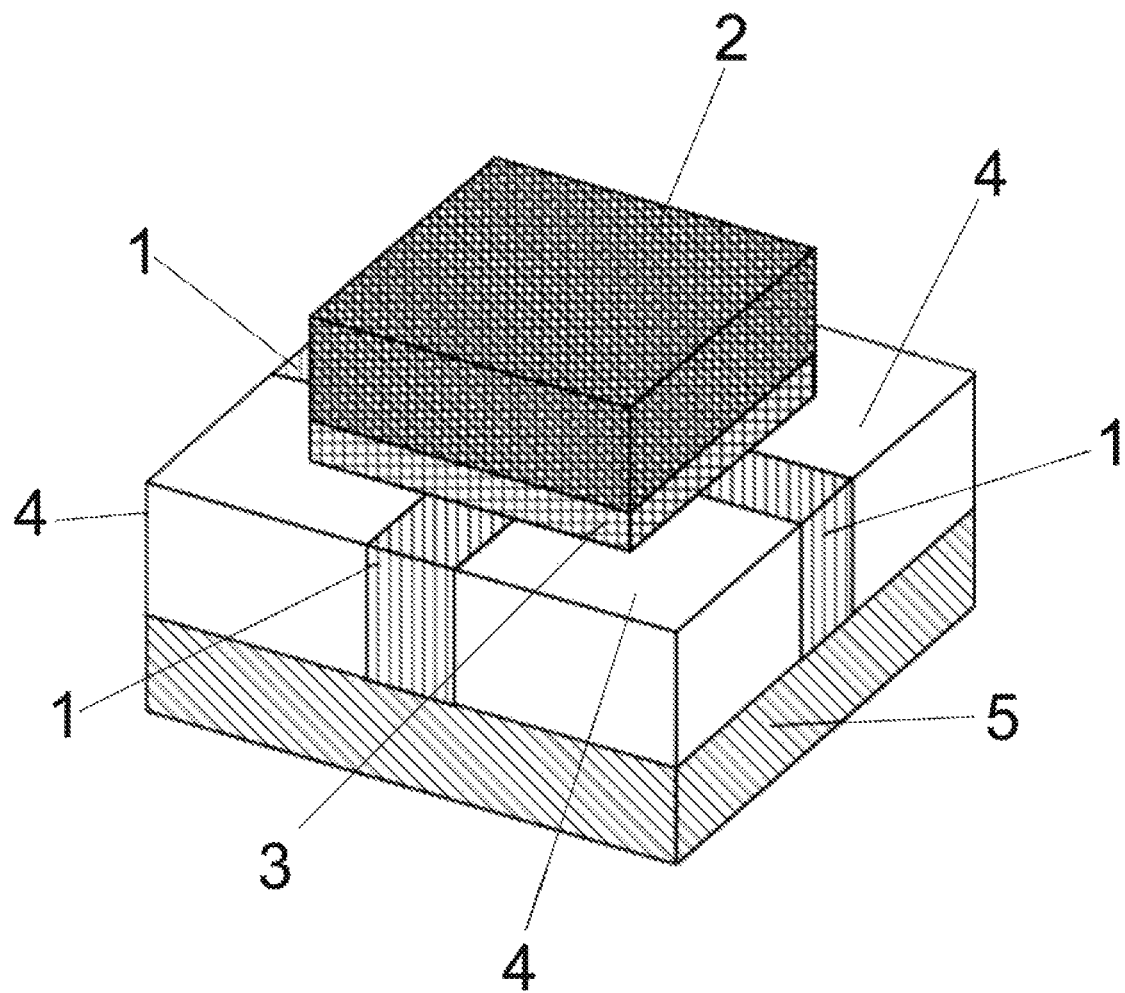
FIG. 3: A three-dimensional view of a four-terminal switch device with a square-shaped planar gate, which is the subject of the invention.
Figure 4:
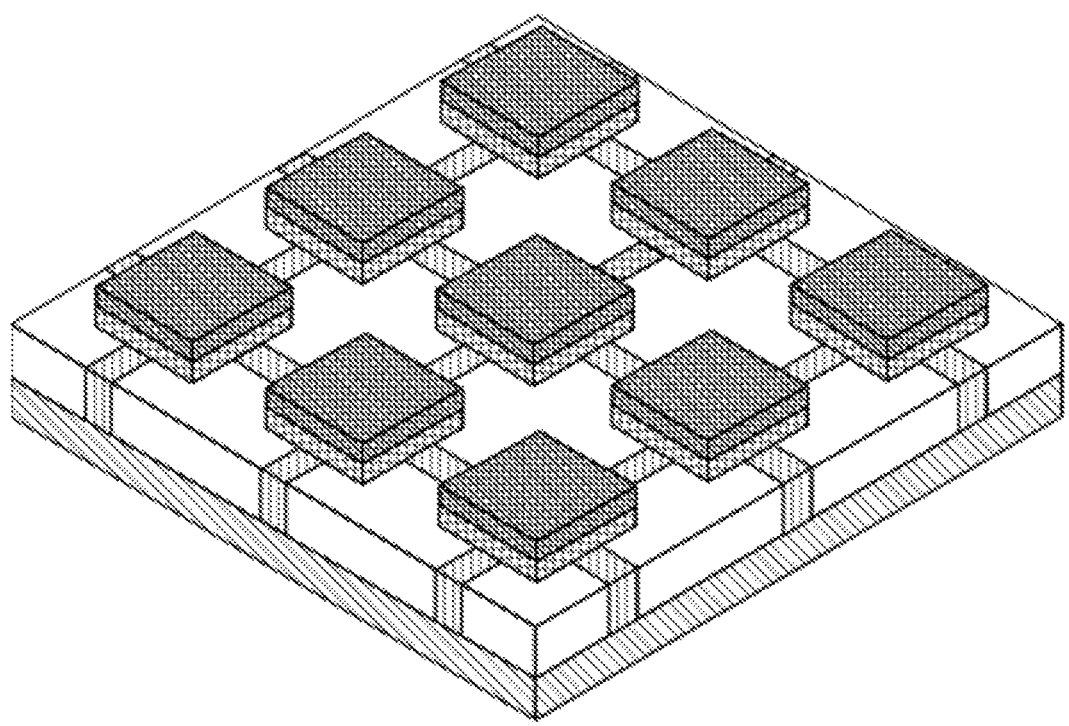
FIG. 4: A three-dimensional view of a 3×3 lattice built with four-terminal switch devices with a square-shaped planar gate, which are the subject of the invention.
Figure 5:
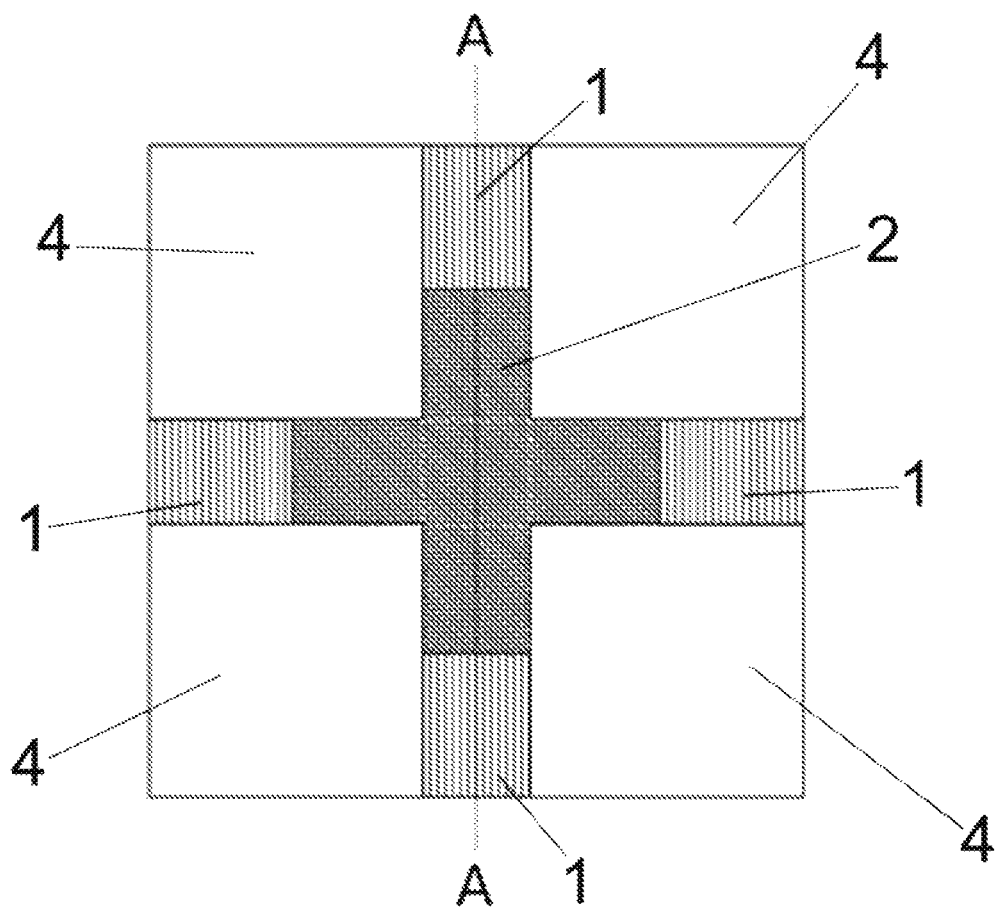
FIG. 5: A top view of the four-terminal switch device with a cross-shaped planar gate, which is a different embodiment of the device of the invention.
Figure 6:
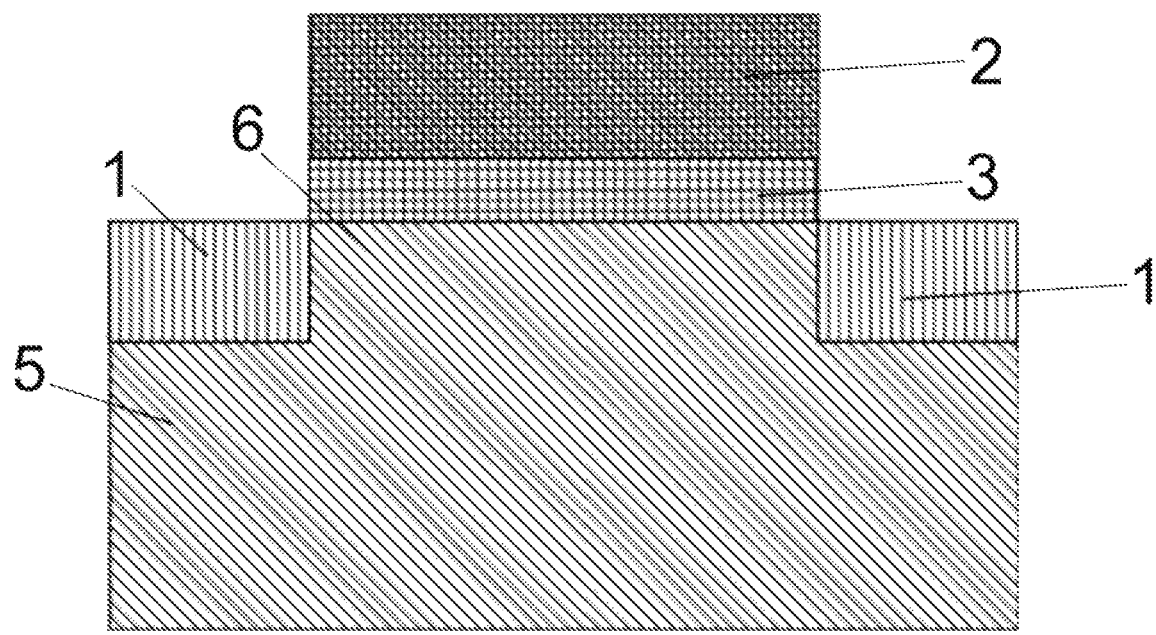
FIG. 6: A cross-sectional view of the four-terminal switch device with a cross-shaped planar gate, which is a different embodiment of the device of the invention.
Figure 7:
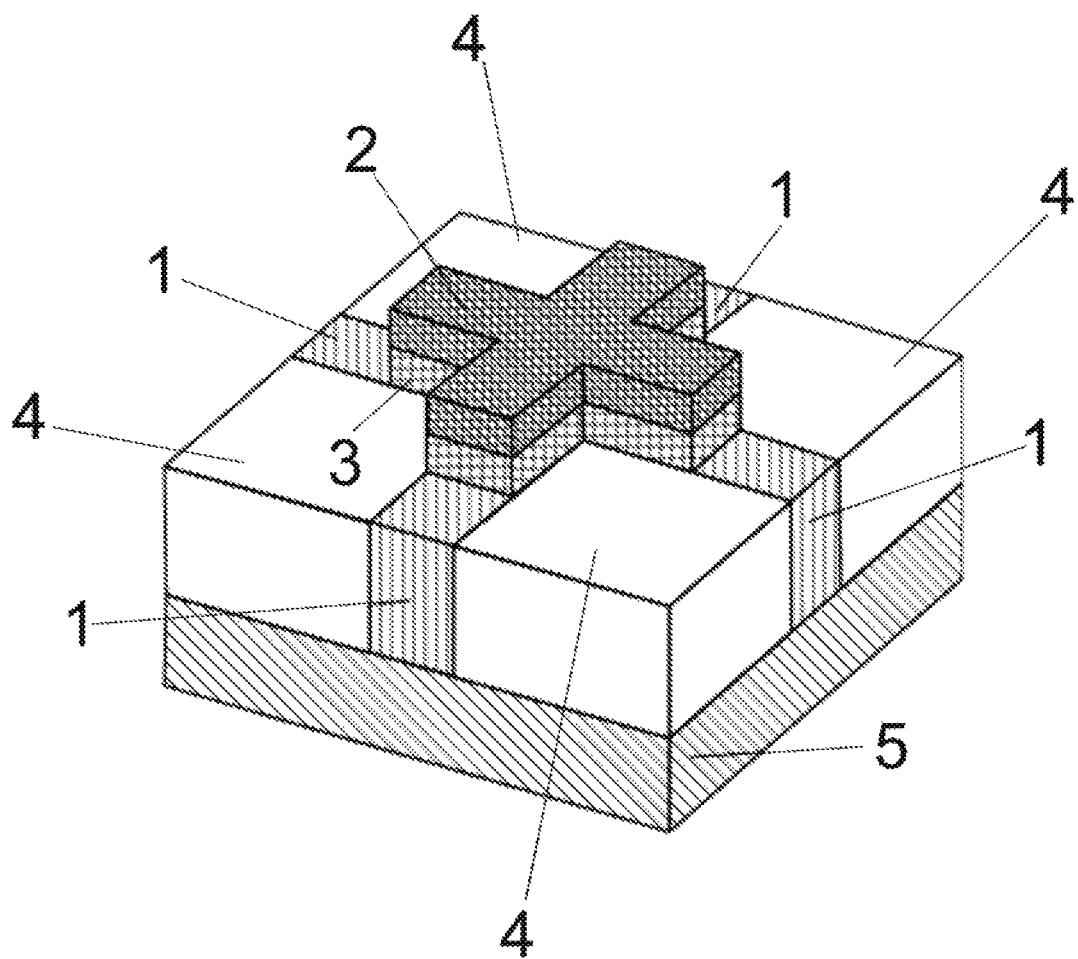
FIG. 7: A three-dimensional view of the four-terminal switch with a cross-shaped planar gate which is a different embodiment of the device of the invention.
Figure 8:
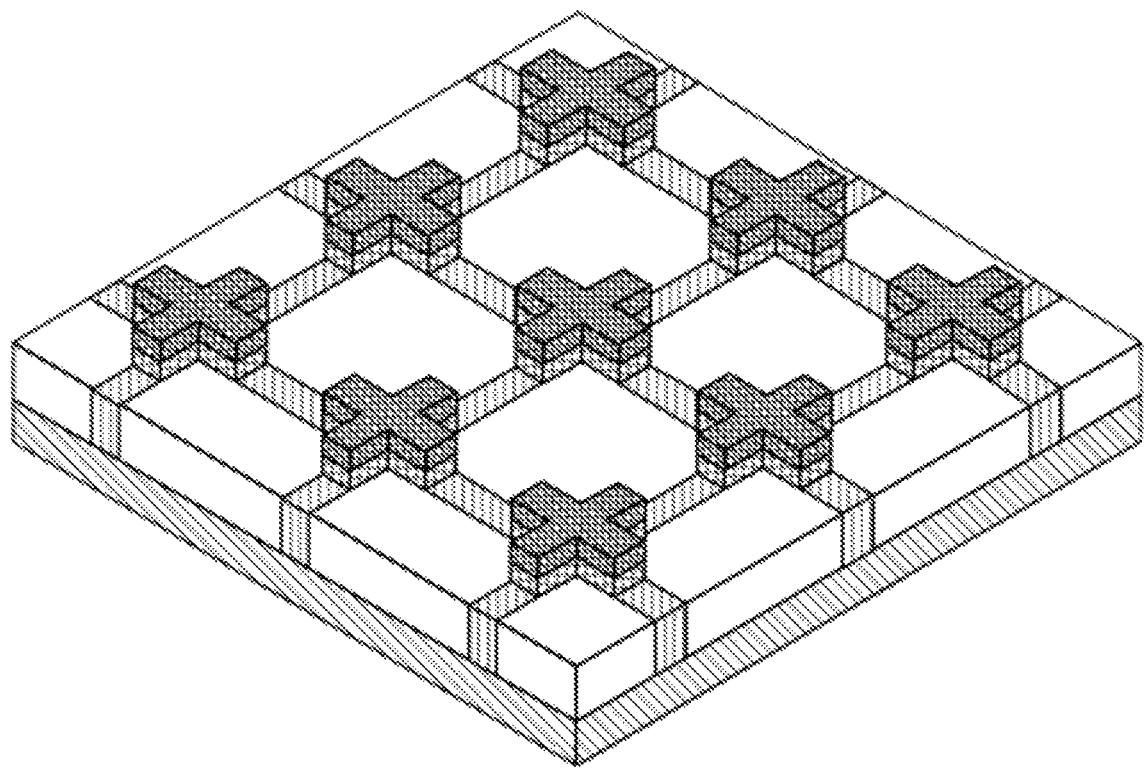
FIG. 8: A three-dimensional view of a 3×3 lattice built with four-terminal switch devices with a cross-shaped planar gate which are different embodiments of the device of the invention.
Figure 9:
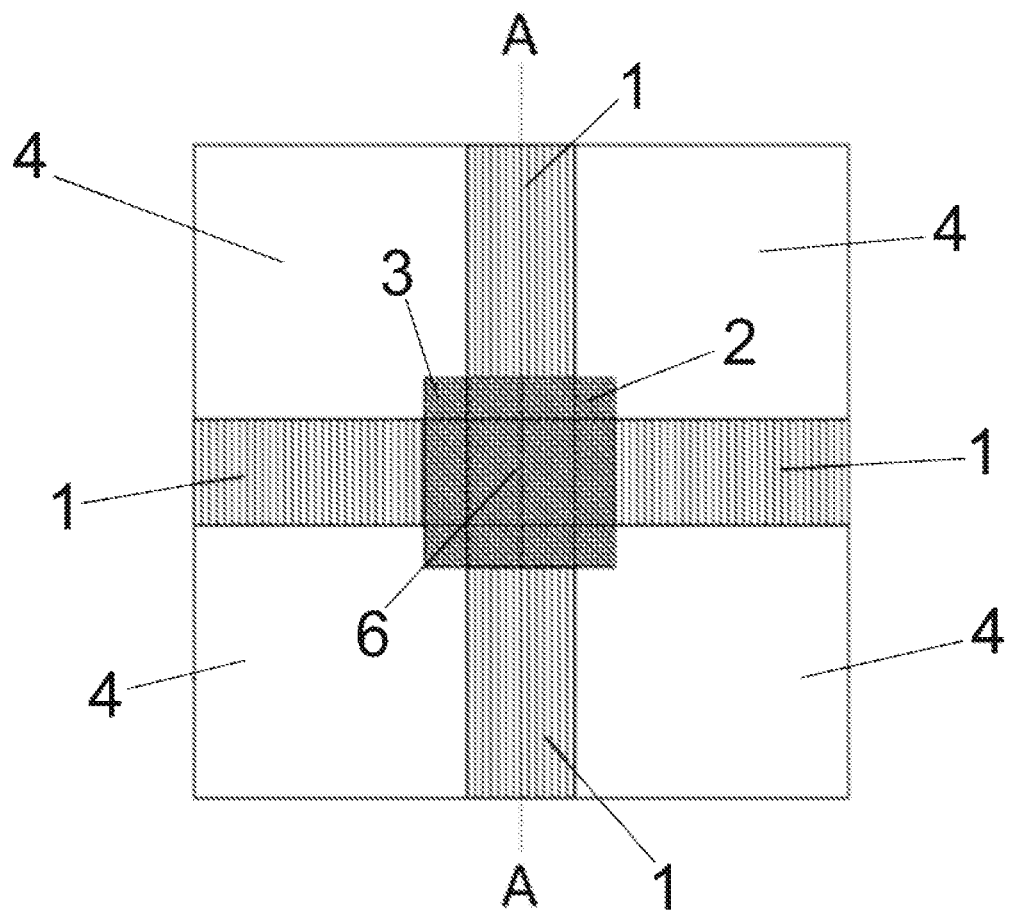
FIG. 9: A top view of the four-terminal switch device with a fin-shaped gate, which is the subject of the invention.
Figure 10:
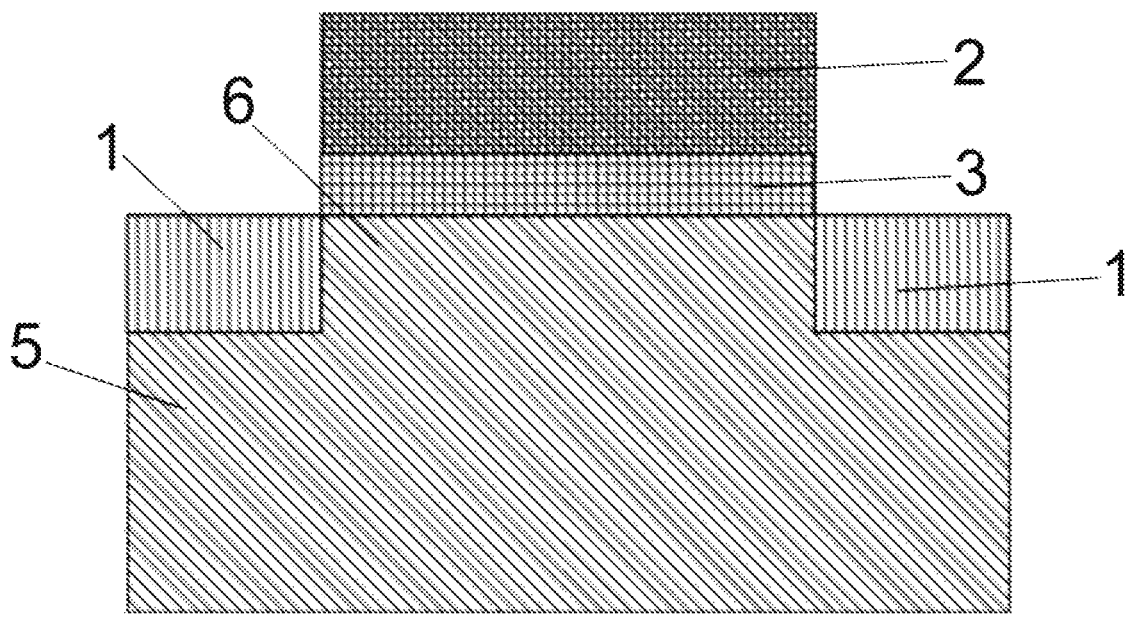
FIG. 10: Cross-sectional view of the four-terminal switch device with a fin-shaped gate, which is the subject of the invention.
Figure 11:
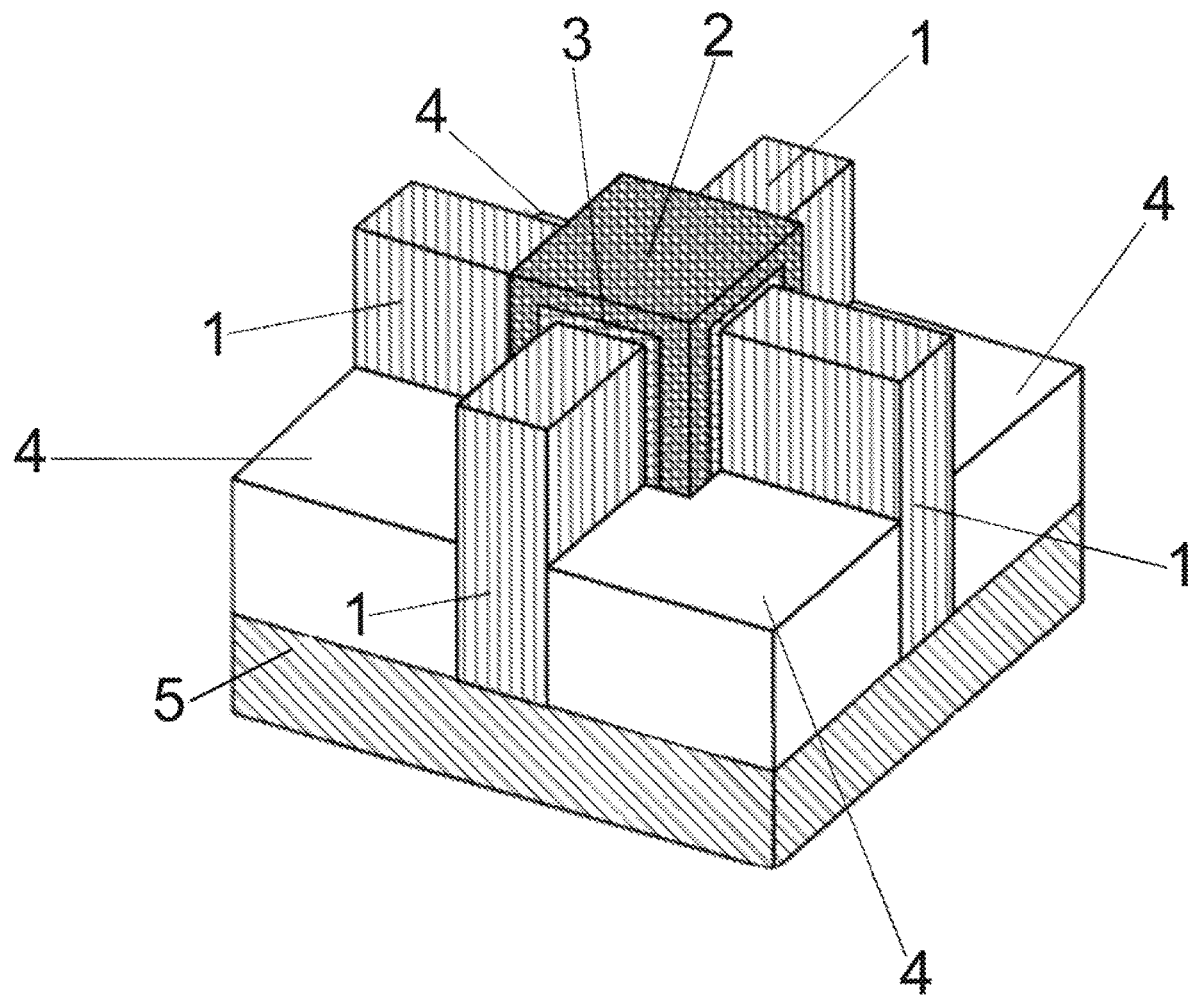
FIG. 11: A three-dimensional view of a four-terminal switch device with a fin-shaped gate, which is the subject of the invention.
Figure 12:
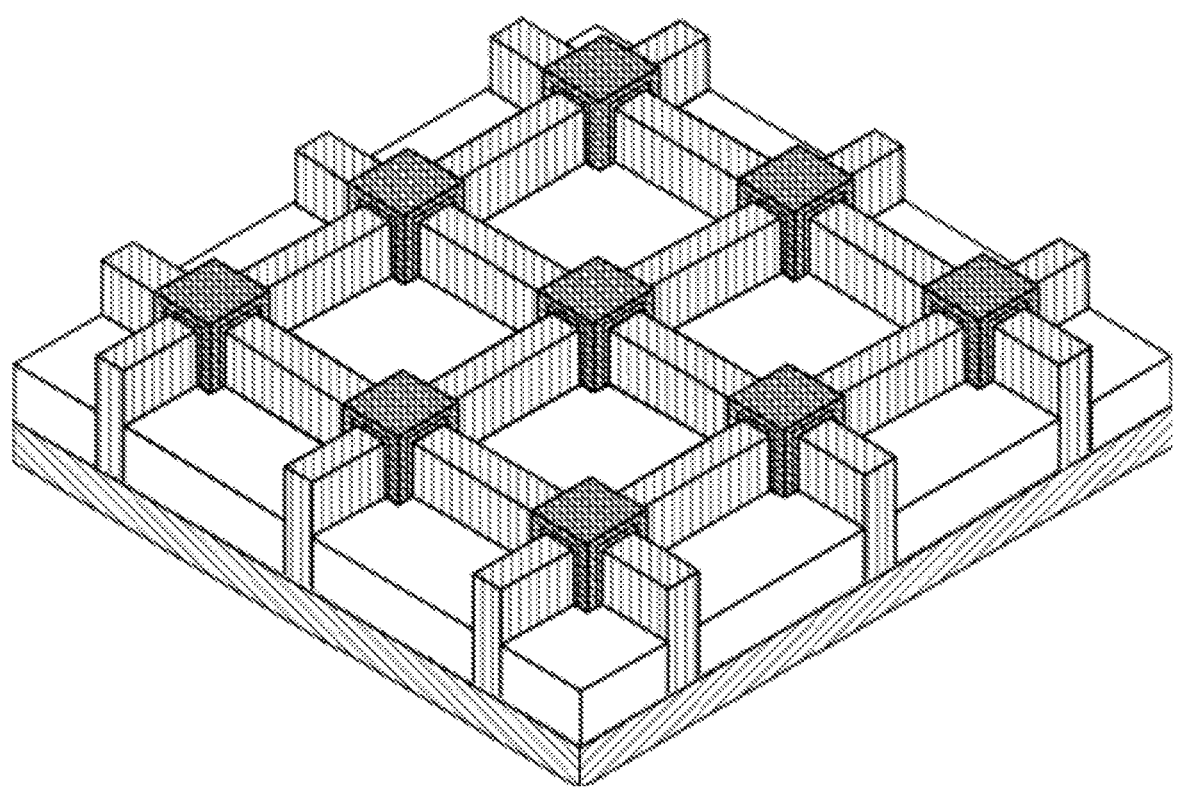
FIG. 12: A three-dimensional view of a 3×3 lattice built with four-terminal switch devices with a fin-shaped gate, which are the subject of the invention.
Figure 13:
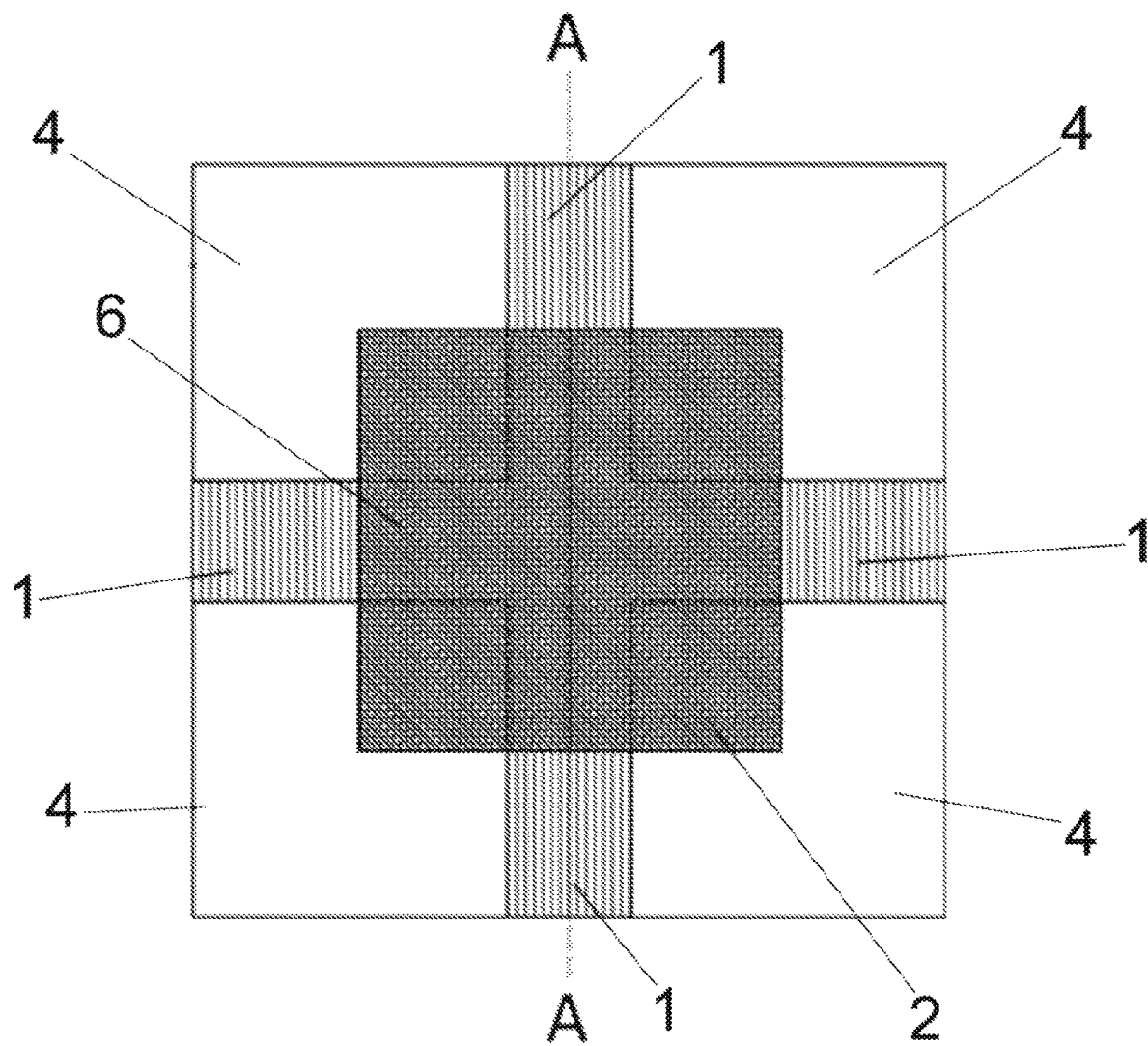
FIG. 13: A top view of the CMOS-compatible four-terminal switch which is a different embodiment of the device subject of the invention.
Figure 14:
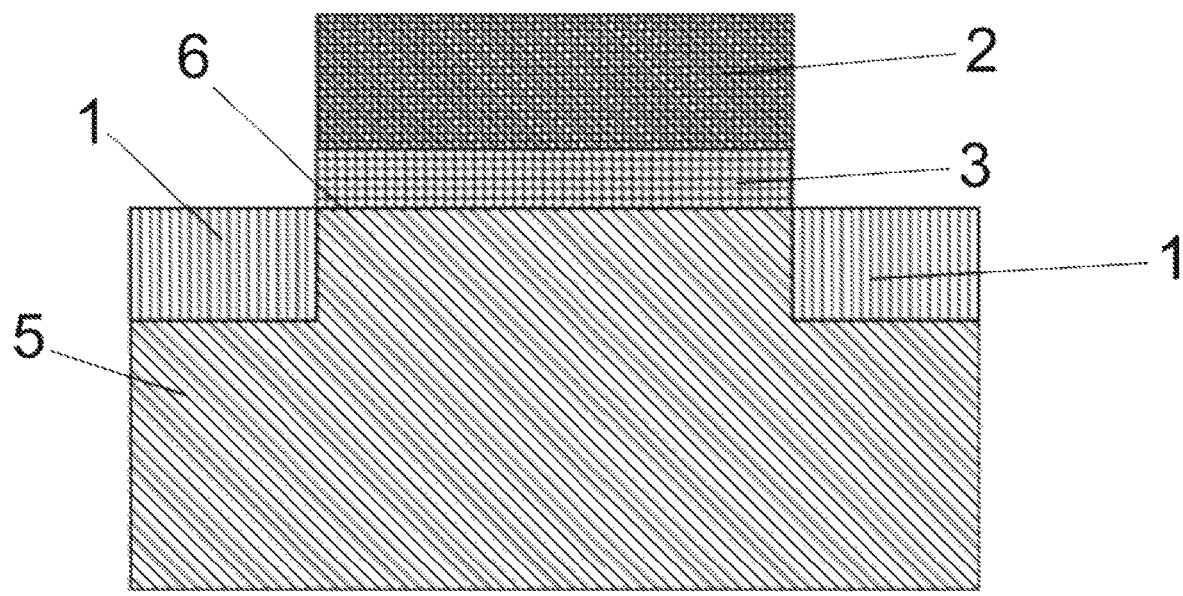
FIG. 14: A cross-sectional view of the CMOS-compatible four-terminal switch which is another embodiment of the device subject of the invention.
Figure 15:
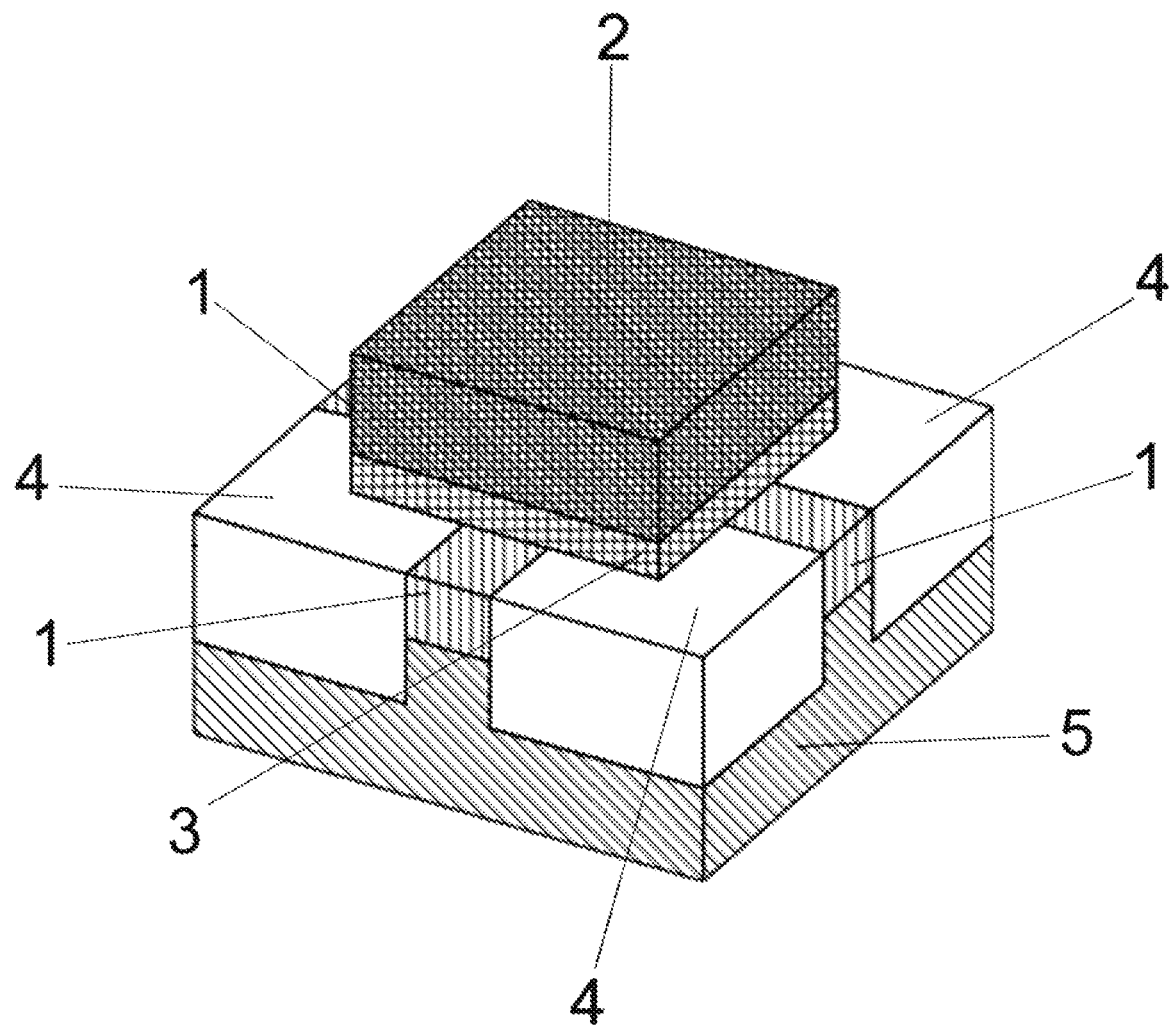
FIG. 15: A three-dimensional view of the CMOS-compatible four-terminal which is another embodiment of the device subject of the invention.
Figure 16:
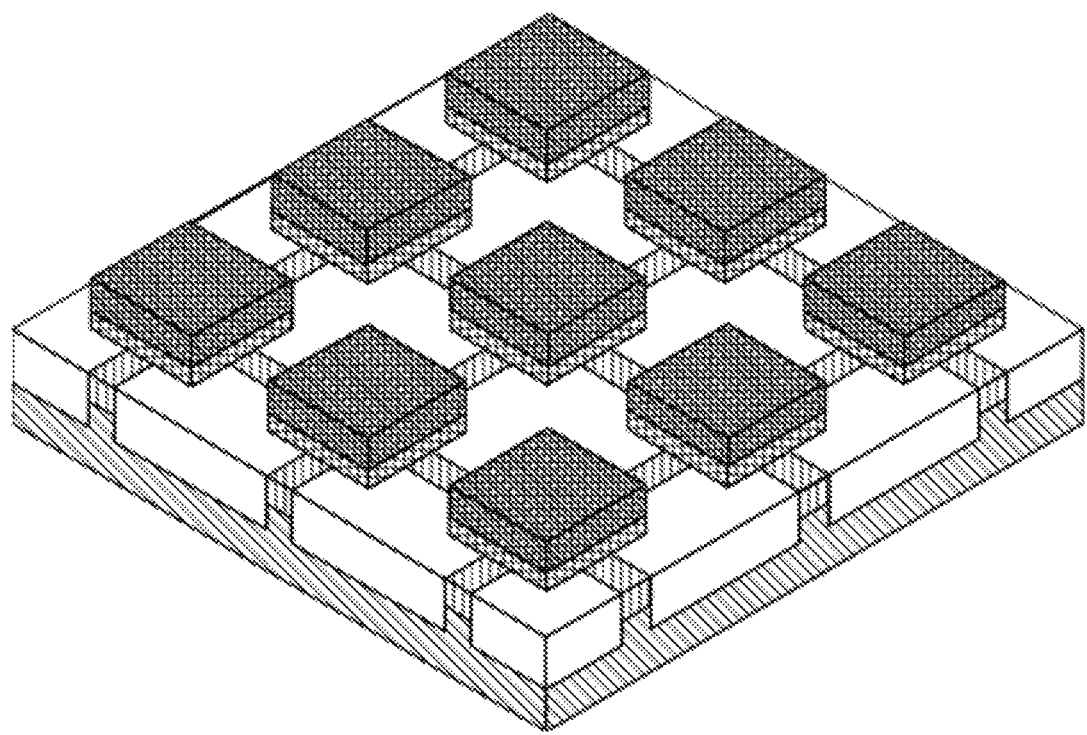
FIG. 16: A three-dimensional view of a 3×3 lattice built with CMOS-compatible four-terminal switch devices which are other embodiments of the device subject to the invention.
Figure 17:
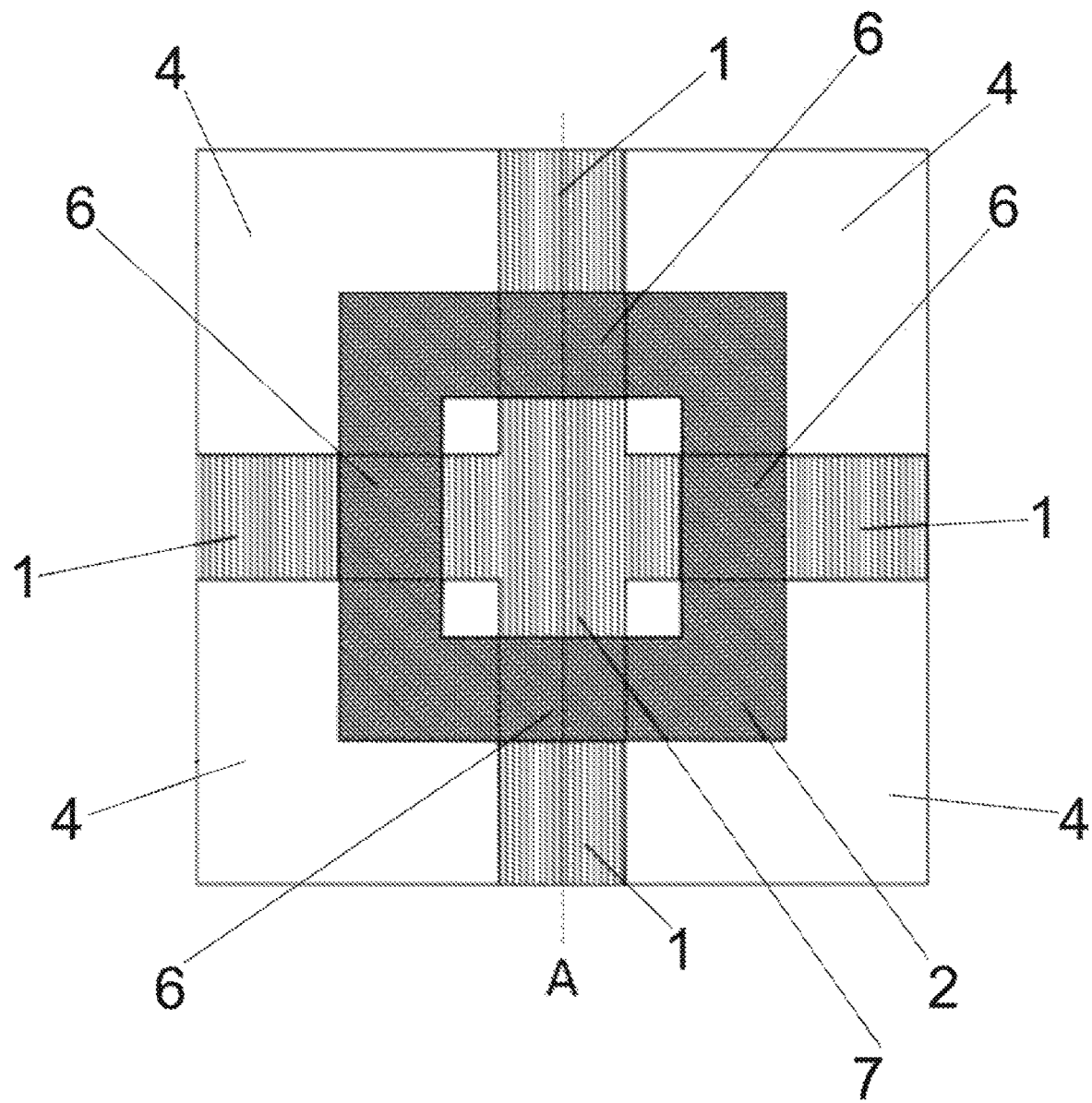
FIG. 17: A top view of the four-terminal switch with a floating diffusion node according to another embodiment of the device which is subject of the invention.
Figure 18:
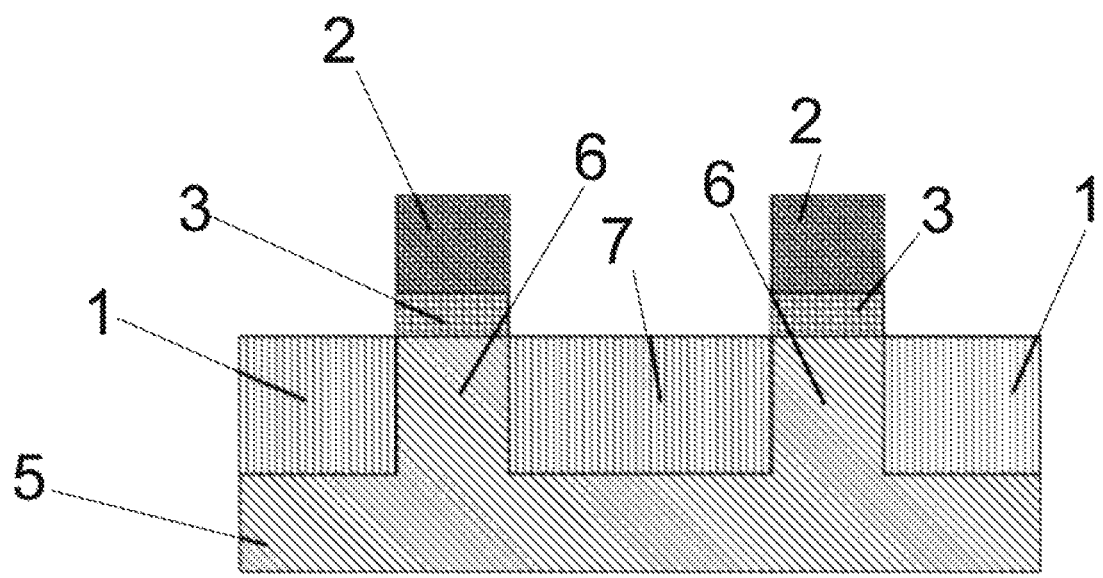
FIG. 18: A cross-sectional view of the four-terminal switch with a floating diffusion node according to another embodiment of the device which is subject of the invention.
Figure 19:
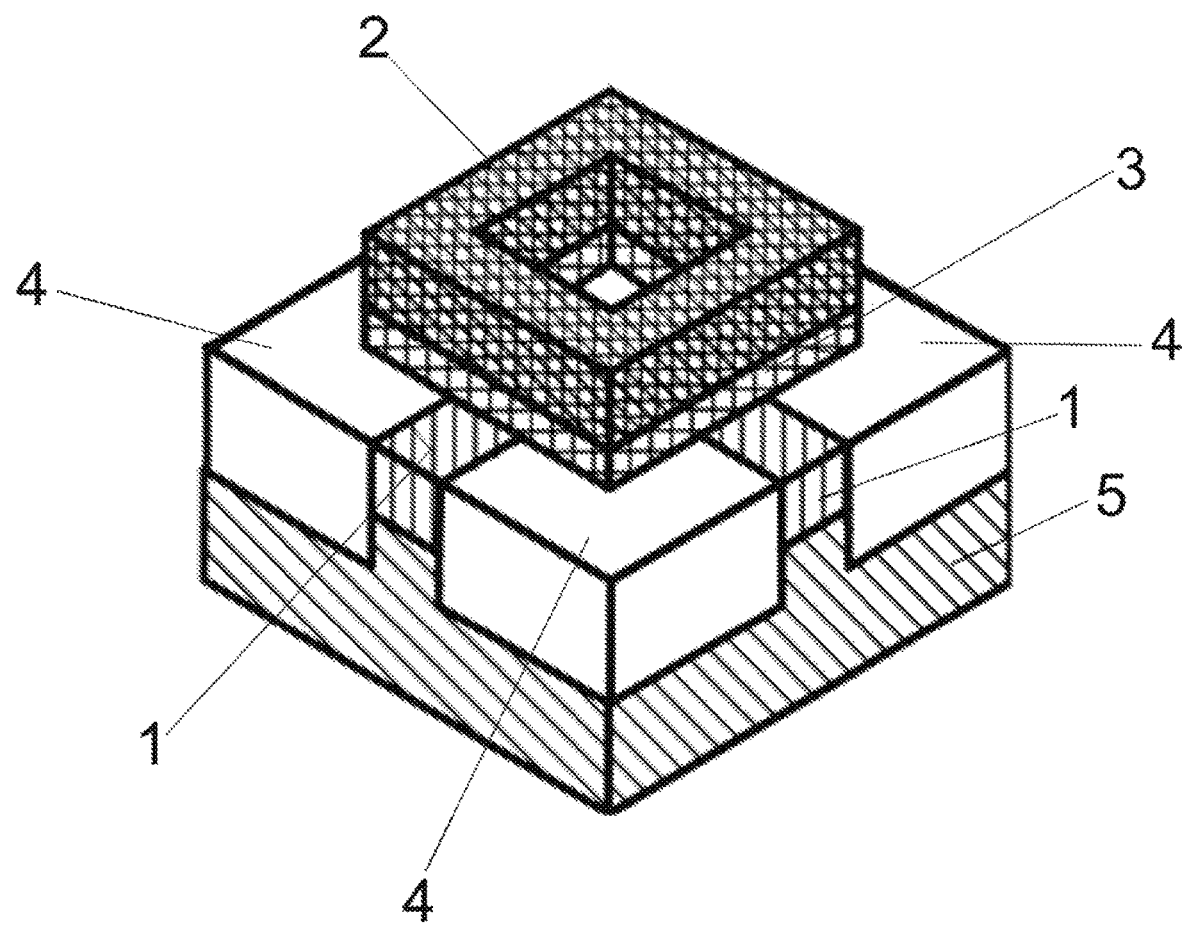
FIG. 19: A three-dimensional view of the four-terminal switch with a floating diffusion node according to another embodiment of the device which is subject of the invention.
Figure 20:
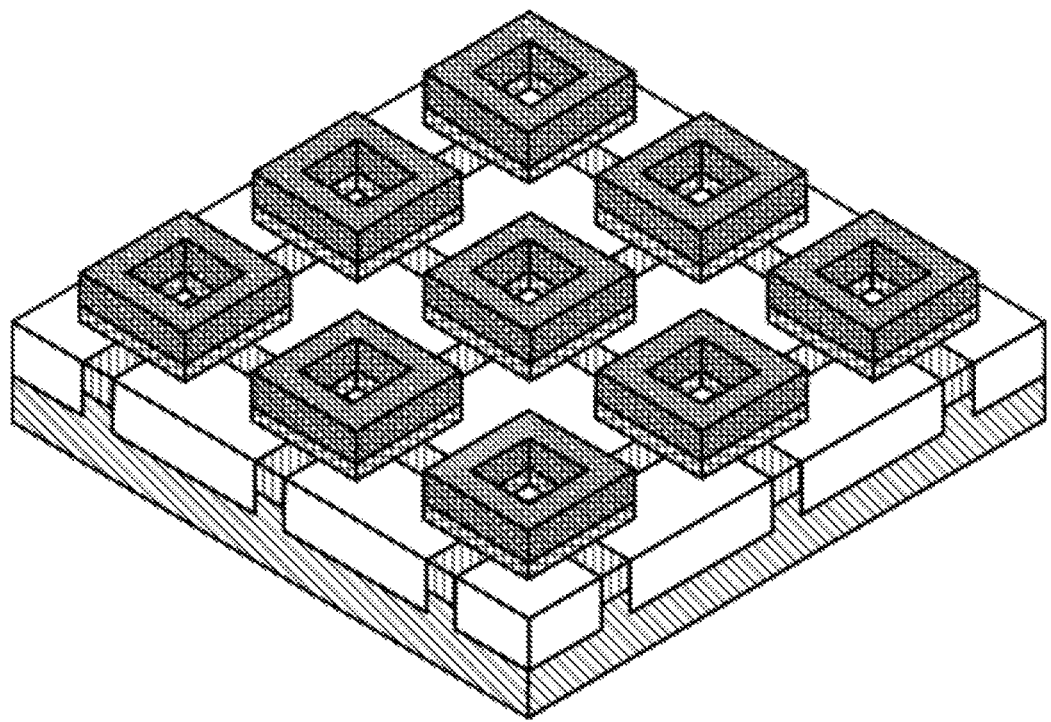
FIG. 20: A three-dimensional view of a 3×3 lattice built with CMOS-compatible four-terminal switches with floating diffusion nodes which are different embodiments of the device subject to the invention.

The parts of the device are numbered individually and their numbers are given below:
1. Diffusion region
2. Gate electrode
3. Gate insulator region
4. Local Oxidation of Silicon (LOCOS) or Shallow Trench Isolation (STI) layers
5. Bulk layer
6. Channel
7. Floating Diffusion Node

DETAILED DESCRIPTION OF THE EMBODIMENTS

Device subject to the invention includes:
A body layer containing all of the components 5,
A channel region 6 located at the surface of the body layer 5,
Four diffusion regions 1 created on the surface of the body layer 5 around the channel or channels 6,
Local Oxide (LOCOS) or Shallow Trench Isolation (STI) layers 4 located in the body layer 5 surrounding the switch structure,
Gate insulator 3 located over the channel 5,
A gate metal layer 2 located on the gate insulator 3,
A floating diffusion node 7 located between 4 channel zones 6 in four channel structure, For decades, performance improvements are achieved by miniaturization approaches in CMOS device dimensions. The distance between the source-drain in the relevant devices is referred to as channel length, which is one of the most important parameters in device performance. This value is reduced primarily in device miniaturization. However, since the beginning of the 2000s, serious problems have been encountered in the design and production of conventional CMOS devices at channel sizes below of 100 nm (7 nm at present). Currently, it is widely accepted that CMOS scaling will stop in a decade. At this critical point, we propose a different device based on a four-terminal switch rather than devices based on two-terminal switches such as CMOS devices. Our device and its lattice form is "CMOS-compatible", that can be fabricated fundamentally using the fabrication processes of the CMOS technology.

As a result, with the device according to the invention, new technology is presented leaning on the implementation of four-terminal switching lattices based on CMOS technology, using a much smaller circuit area than the conventional CMOS technology.

The benefits of the device according to the invention are listed below;

High Efficiency for Circuit Area and Power due to High Interconnect-Efficiency

The proposed device can be used in crossbar based lattice structures. These structures are dense and each four-terminal switch is directly connected to its four neighbors without a need of metal (or similar interconnect material), so they are efficient considering the wiring interconnect problem in the conventional CMOS technology. Indeed, the interconnect wires occupy a significant area in CMOS circuits and systems.

High Efficiency for Circuit Area and Power due to the Device's Ability to Conduct Current in Two Dimensions The four-terminal switch based device conduct current between its four source/drain terminals using a single channel region. Therefore there are 4-choose-2=6 different current paths in two dimensions. On the other hand, the conventional MOS transistor has 2 source/drain terminals with a single current path in one dimension. This property of four-terminal switches allows rich variety of paths in computing with switching lattices. For example, a 6×6 lattice has more than 1000 different current paths from the top to the bottom of the lattice.

CMOS Technology Compatibility

One of the important features of the device according to the invention is that it is compatible with existing and developing fabrication technologies. The CMOS compatibility at the technology level allows the direct integration of the device into developing and future fabrication techniques developed for CMOS.

Direct Implementation of the Four-Terminal Switch with Two-Terminal CMOS (MOS transistors) Switches A four-terminal switch can be effectively produced using two-terminal switches (MOS transistors) in existing CMOS technologies. A four-terminal switch can be implemented by connecting the drains and gates of four MOS transistors with each other and defining sources to form four ends of the switch. The layout of the respective lattice structure can be carried out by using a relatively small area since there is no metal contact between switches in the existing CMOS technology. A transistor without metal contacts in source and drain regions are significantly smaller than a transistor with metal contacts.

Similar to MOS and/or FET transistor devices, the four-terminal switch based device can be produced as N-type or P-type. The device according to the invention is produced on bulk material consisting of group IV elements (Si, Ge) and/or alloys and/or compounds of group II-VI elements (GaAs, ZnS, GaAs, GeSi, AlN, GaN, SiC, $SiO_2$). The device according to the invention consists of four regions elementally doped, which can be defined as source and drain regions, the channel between these terminals (elementally doped or non-doped). The four terminals defined are as drain and source regions are at an equal distance to each other. An insulator layer (e.g., metal oxide compounds such as $SiO_2$, $HfO_2$) is created on top of the channel region. A gate metal layer is placed on top of the insulator. When voltage is applied to the gate terminal, capacitor is formed between the gate and the channel and electrical charge is collected in the channel region and the region which normally is not conductive becomes conductive. When the channel is conductive, the four terminals are electrically connected. The device operates by means of the logical value produced by the switch being on or off. This ensures that the four terminals are controlled by one gate at a time.

The insulating layer defined on the channel between the four terminals may be in the channel geometry, and it may also be a square, plus, triangle, hexagonal, octagonal equilateral and/or non-equilateral polygonal or circular shape. In order to control the threshold voltage value, different insulating layer shapes may be preferred. Different gate materials (periodic table transition metals and/or oxidized and/or nitride components of III-V group metals such as MgO, ZrN, $ZrO_2$, $Al_2O_3$, $Y_2O_3$, $Ta_2O_5$, $La_2O_3$, $TiO_2$, TiN, $HfO_2$, Gao, $Ge_2O_3$, $Al_2O_3$, $SiO_2$, $Si_3N_4$) can be used to control the threshold voltage by taking into account the dielectric constant values.

The gate consisting of the insulating layer and the metal electrode can be scaled for device performance improvement. Gate may be a planar electrode and/or a geometrical structure surrounding the terminals such as fin-shaped gate.

It is also possible to produce a four-terminal switch directly with standard CMOS production technology without requiring any additional production steps. MOSFET (Metal Oxide Semiconductor Field Effect Transistor) transistors, which can be produced in standard CMOS technologies, are composed of two diffusion regions (1) are created, which can be used as drain and/or source at separated by a channel. In the same technology, a four-terminal switch can be built by forming four diffusion regions (1) around four ends of the channel. The current flowing between the four terminals around the channel of the new structure will be controlled by a single gate electrode placed over the channel.

What is claimed is:

1. A device comprising:
a bulk layer,
a single transistor channel or four distinct transistor channels located at a surface of the bulk layer,
four diffusion regions positioned around the single transistor channel or the four diffusion regions and the four distinct transistor channels configured around a floating diffusion node, and
a Local Oxide (LOCOS) or a Shallow Trench Isolation (STI) layer located surrounding diffusion layers and channel region(s).

2. The device according to claim 1, further comprising a gate insulator layer located over the single transistor channel or the four distinct transistor channels.

3. The device according to claim 1, further comprising a single gate electrode located on a gate insulator and the LOCOS or STI layer.

4. The device according to claim 1, wherein, an electrical conductivity of the single transistor channel or the four distinct transistor channels is controlled with a voltage applied to a gate electrode.

5. The device according to claim 4, wherein, the four diffusion regions are electrically connected or disconnected depending on the electrical conductivity of the single transistor channel or the four distinct transistor channels.

6. The device according to claim 5, wherein, four terminals of the device are connected or disconnected by controlling the voltage on the gate electrode.

7. A lattice structure consisting of the device of claim 1, wherein, four terminals of the device are connected to four neighbor devices without metal contacts and interconnects.

8. The lattice structure according to claim 7, wherein, logic functions are implemented in a smaller chip area compared to a CMOS logic.

* * * * *